United States Patent [19]

Newton et al.

[11] 4,288,750
[45] Sep. 8, 1981

[54] SURFACE ACOUSTIC WAVE TIME CHIRP DEVICES

[75] Inventors: Cleland O. Newton, Malvern Wells; Edward G. S. Paige, Horton-com-Studley, both of England

[73] Assignee: The United States of America as represented by the Secretary of the Army, Washington, D.C.

[21] Appl. No.: 34,540

[22] Filed: Apr. 30, 1979

[51] Int. Cl.$^3$ .............................................. H03K 3/00
[52] U.S. Cl. .................................. 328/158; 328/55; 328/167; 343/17.2 PC; 375/1; 364/825
[58] Field of Search .................. 328/55, 56, 158, 159, 328/167; 343/17.2 PC; 455/111, 118; 375/1, 59; 364/824, 825, 861; 333/150, 152

[56] References Cited

U.S. PATENT DOCUMENTS

| | | | |
|---|---|---|---|
| 3,225,349 | 12/1965 | Thor | 343/17.2 PC X |
| 3,261,969 | 7/1966 | Routh | 343/17.2 PC X |
| 3,808,594 | 4/1974 | Cook et al. | 343/17.2 PC X |
| 3,936,751 | 2/1976 | Holmes et al. | 333/152 X |
| 4,169,286 | 9/1979 | Uzunoglu et al. | 364/861 X |

OTHER PUBLICATIONS

Williamson, Properties & Applications of Reflective-Array Devices, Proc. of the IEEE, May 1976, pp. 702-710.

Primary Examiner—Paul L. Gensler
Attorney, Agent, or Firm—Nathan Edelberg; Jeremiah G. Murray; Edward Goldberg

[57] ABSTRACT

Surface acoustic wave dispersive delay lines provide a chirp signal generator and filter capable of producing signals of which the frequency-time slope can be varied. The chirp signal generator includes two surface acoustic wave delay lines, means for impulsing the delay lines with a variable relative time delay, and a mixer for combining the outputs of the two delay lines. The variable dispersion filter includes two delay lines, means for impulsing the delay lines with a variable relative time delay, a first mixer for combining an input signal with the output of one delay line and a second mixer for combining the output of the first mixer with the output of the other delay line. Variation in the time delay between the impulsing of the two delay lines produces a variation in the chirp rate at the output signal. The amplitude frequency characteristics of the signal generator and filter may be made non-linear by amplitude weighting one delay line.

16 Claims, 2 Drawing Figures

SURFACE ACOUSTIC WAVE TIME CHIRP DEVICES

BACKGROUND OF THE INVENTION

1. FIELD OF THE INVENTION

This invention relates to surface acoustic wave (SAW) devices, and in particular to variable dispersive SAW devices capable of producing signals having different frequency-time slopes.

2. DESCRIPTION OF THE PRIOR ART

Signals whose frequency varies with time are commonly called chirp signals and are usually generated in one of two ways; either by applying a delay which varies with the frequency of a signal, or by applying a frequency shift which varies with time. The first technique is termed time compression (or dispersion) and the second technique is termed frequency compression (or dispersion), one being the Fourier analogue of the other. A known publication describing the basic piezoelectric element utilized as a surface acoustic wave device and interdigital transducers forming dispersive delay lines or chirp filters is entitled "Hughes-Fullerton Capability Profile and Applications of Acoustic Surface Wave Devices", published by Hughes Aircraft Company, May 1971.

In co-pending UK Patent Application No. 39376/76 there is described a SAW dispersive filter (chirp filter) comprising two SAW dispersive delay lines connected in series, both having a cubic, or a higher order phase variation characteristic with frequency, a variable frequency oscillator, and two mixers for mixing the oscillator output with signals entering and leaving one of the delay lines. In such filters the dispersive delay, and hence the frequency-time slope of the chirp signals produced, can be varied by varying the frequency of the variable frequency oscillator.

SUMMARY OF THE INVENTION

According to one aspect of the present invention a chirp signal generator comprises two surface acoustic wave dispersive delay lines both having a cubic or a higher order phase variation characteristic with time, means for impulsing the inputs of the two delay lines with a variable relative time delay between the impulsing of the two delay line inputs, and a mixer for mixing together the outputs of the two delay lines.

Preferably the cubic and higher order terms in the phase variation characteristics of the two delay lines are matched so as to produce an output signal of which the frequency-time slope, or chirp rate is linear. Variation of the time delay between the impulsing of the two delay lines produces a variation in the chirp rate of the output signal.

The amplitude frequency characteristic of the chirp signal may be weighted by amplitude weighting one delay line, the other delay line then being unweighted and having a substantially flat frequency response over its operative bandwidth. A typical weighting function for radar applications is the $\cos^2$ weighting function which effectively reduces the amplitude of the chirp signals other than at centre frequency and is used to improve the directional sensitivity of the radar system. When amplitude weighting of this kind is employed it is necessary to ensure that the whole of the output of the weighted delay line occurs within the duration of the output of the unweighted delay line. This is achieved by making the unweighted delay line longer than the weighted delay line.

According to a second aspect of the present invention a variable dispersion filter comprises two surface acoustic wave dispersive delay lines both having a cubic, or higher order phase variation characteristic with time, means for impulsing the inputs of the two delay lines with a variable relative time delay between the impulsing of the two delay line inputs, a first mixer for mixing an input signal with the output of one of the delay lines and a second mixer for mixing the output of the first mixer with the output of the other delay line.

As with the chirp signal generator, the cubic and any higher order terms in the phase variation characteristics of the two delay lines are preferably matched so as to produce an output signal of which the frequency-time slope, or chirp rate, is linear. Again also, the variation in the time delay between the impulsing of the two delay lines produces a variation in the chirp rate at the output signal; and the filter may be weighted to provide a non-linear frequency amplitude characteristic by amplitude weighting one delay line, and by making the other delay line unweighted and longer than the weighted delay line.

The variable time delay impulsing means for either the chirp generator or the chirp filter may be of any suitable form capable of producing short duration pulses of variable separation and preferably having a relatively wide, substantially flat frequency spectrum. In one form of impulsing means, the relative timing of the impulses to the delay lines is controlled by counting means in which the count may be varied to vary the separation of the impulses. The impulsing means may further include means for automatically varying the relative separation of the impulses applied to the two delay lines after each cycle, such as in a pseudo random manner, so that the chirp rate of the output pulses varies from pulse-to-pulse.

It can be seen that dispersion filters in accordance with this aspect of the present invention are filters in the time domain and are the Fourier dual of the variable dispersion filters described in the above earlier British patent application producing frequency compression (or dispersion) rather than time compression (dispersion).

Dispersion filters in accordance with this invention may be combined with dispersion filters in accordance with the invention of the earlier patent application to produce a variable time, variable bandwidth ("all singing, all dancing") filter. This is achieved by connecting the output of a time doman filter in accordance with the present invention to the input of a frequency domain filter of the earlier application.

The invention will now be described by way of example only with reference to the accompanying drawings.

DESCRIPTION OF THE PREFERRED EMBODIMENTS

Figure 1:
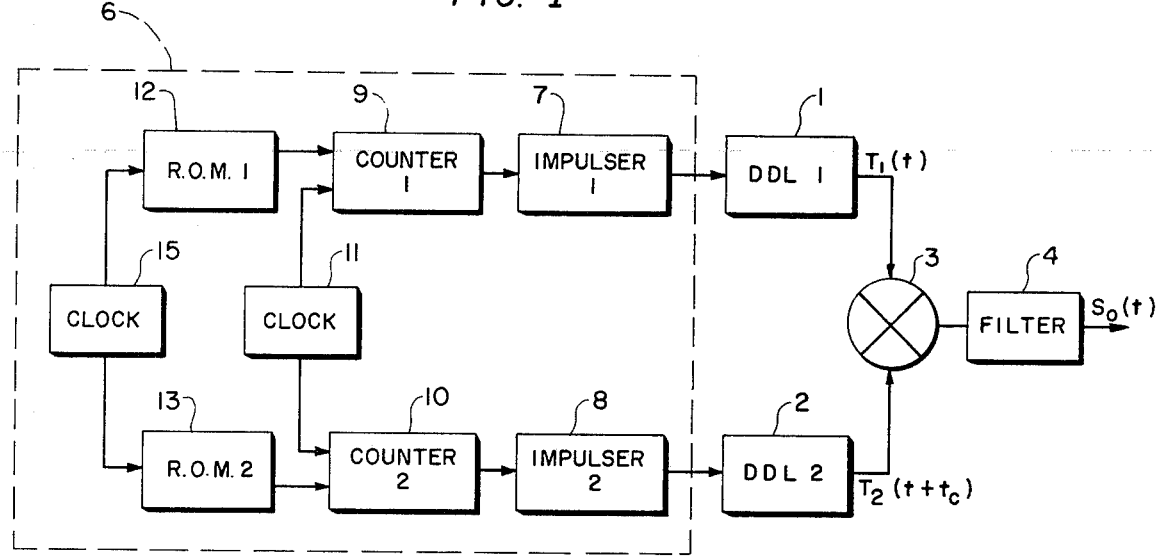
FIG. 1 is a block circuit diagram of a chirp signal generator in accordance with the first aspect of the present invention.

Referring to the drawings, the chirp signal generator shown in FIG. 1 comprises first and second SAW dispersive delay lines 1, 2 the inputs of which are impulsed by a variable time delay impulsing circuit 6, and the outputs of which are mixed in a mixer 3. The output of the mixer 3 is then filtered by an output filter 4 which is arranged to pass either the sum frequency or difference frequency output only of the mixer. The delay lines 1, 2 are of a known kind each comprising input and output interdigital SAW transducers disposed at opposite ends of a surface acoustic wave propagation path on the surface of a suitable propagating medium, such as lithium niobate or quartz.

In accordance with the invention, each of the delay lines has a cubic phase variation characteristic with time. Thus, it is assumed that the respective impulse responses of the two delay lines 1, 2 are:

$$T_1(t)e^{i\theta 1(t)}; T_2(t)e^{i\theta 2(t)}$$

where
$\theta_1(t) = \theta_{10} + a_1 t + b_1 t^2 + c_1 t^3$
$\theta_2(t) = \theta_{20} + a_2 t + b_2 t^2 + c_2 t^3$
and where
t is time,
$\theta_{10}$, $\theta_{20}$ are fixed phase constants in the respective delay lines 1, 2,
$\theta_1$, $\theta_2$ are the phases of signals in the respective delay lines 1, 2, and
$a_1$, $b_1$, $c_1$ and $a_2$, $b_2$, $c_2$ are constants.

Upon impulse, the output of the two dispersive delay lines 1, 2 will be:

$$T_1(t) = T_1 \cos(\theta_{10} + a_1 t + b_1 t^2 + c_1 t^3)$$

$$T_2(t) = T_2 \cos(\theta_{20} + a_2 t + b_2 t^2 + c_2 t^3)$$

If the output filter 4 is arranged to pass only the sum frequency output of the mixer 3, then the output signal $S_o(t)$ produced by the circuit when delay line 1 is impulsed at a time t, and the second delay line 2 is impulsed at time $t + t_c$, will be:

$$S_o(t) = \tfrac{1}{2} T_1 T_2 \cos [\theta_{10} + a_1 t + b_1 t^2 + c_1 t^3 + \theta_{20}$$
$$+ a_2(t + t_c) + b_2(t + t_c)^2 + c_2(t + t_c)^3]$$
$$= \tfrac{1}{2} T_1 T_2 \cos [t(a_1 + a_2 + 2t_c b_2 + 3t_c c_2)$$
$$+ t^2(b_1 + b_2 + 3t_c c_2) + t^3(c_1 + c_2)$$
$$+ \theta_{10} + \theta_{20} + a_2 t_c + b_2 t_c^2 + c_2 t_c^3]$$

In the present sum frequency implementation, if $c_1 = -c_2$, the cubic phase terms are eliminated and a linear chirp signal will be produced. Alternatively, if the output filter is arranged to pass only the difference frequency output of the mixer 3, then the cubic phase terms are matched by making $c_1 = c_2$.

The terms $(b_1 + b_2 + 3t_c c_2)t^2$ give rise to a chirp output signal, the frequency-time slope or chirp rate of which is linear and varies linearly with the relative delay time $t_c$. If the cubic (or higher order) phase terms of the two delay lines were not matched in this way, then the chirp rate of the device would be non-linear.

Thus, the chirp rate of the generator can be varied by varying the relative time delay $t_c$, and the variable time delay impulsing circuit 6 in FIG. 1 is an example of how this may be achieved. The impulsing circuit 6 comprises two impulsers 7, 8 of a known kind, one associated with each of the two delay lines 1, 2, and each arranged, when triggered, to apply to the input of the associated delay line a very short impulse, such as a 50 volt spike of the order of 1 nanosecond duration. Impulses of this kind have a suitably wide and substantially flat frequency spectrum.

Each impulser 7, 8 is associated with a separate counter 9, 10 both driven by a common clock 11 at the same counting rate, and each arranged to trigger its associated impulser 7, 8 upon reaching a preset count. In this way the relative separation of the impulses produced by the two impulsers 7, 8 can be varied by varying the preset count on each of the counters 9, 10. The preset count on each of the counters 9, 10 may be manually adjustable, so as to enable the chirp rate of the generator to be altered as and when desired; or automatically varied as in the present example, to cause the chirp rate of the output signals to vary from pulse-to-pulse.

Each counter 9, 10 is provided with a separate read only memory (ROM) 12, 13 of a known circuit design in the storage locations of which are stored different count numbers for the associated counters 9, 10. The storage locations of the ROMs 12, 13 are both addressed at the same rate by a common clock 15, either cyclically or pseudo-randomly, so as to cause the preset count on the associated counter 9, 10 to be changed to the number stored in the addressed storage location each time a storage location is addressed. At the same time the actual count on both counters 9, 10 is reset to zero.

The chirp generator may be arranged to produce amplitude weighted chirp signals in which the amplitude varies with frequency. This is achieved by amplitude weighting the second delay line 2 (such as by appropriately varying the overlap of the interdigitated finger electrodes of its input and/or output transducer along its length) and by making the first delay line 1 sufficiently long to ensure that the output of the second delay line falls wholly within the duration of the output of the first delay line. This is necessary since the effect of the weighting of the second delay line on the final output signal can only be predicted if the whole of the weighting function is embodied in the output signal. A description of amplitude weighted delay lines is found in the aforesaid Hughes Aircraft Co. publication on pages 5-2 to 5-6.

Figure 2:
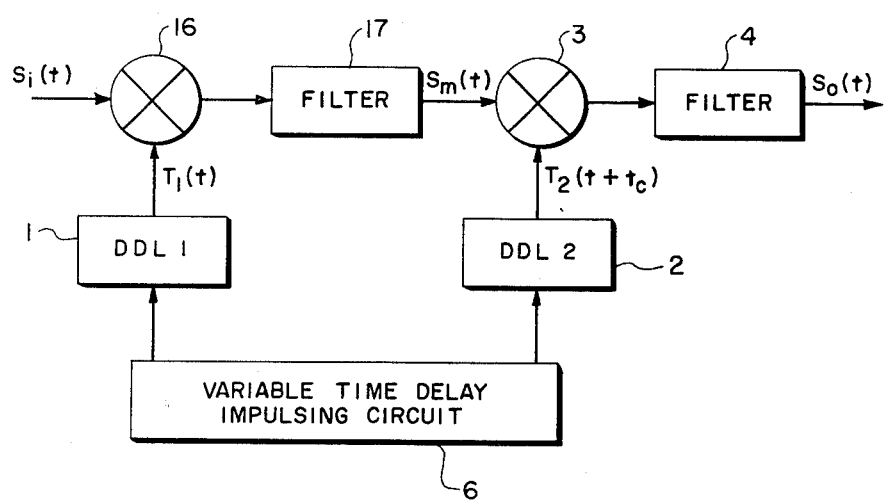
FIG. 2 is a block schematic diagram of a SAW dispersive filter in accordance with the second aspect of the present invention.

FIG. 2 shows in block circuit form how the invention may be implemented as a variable chirp filter. The arrangement differs from the chirp generator circuit of FIG. 1 (the same reference numerals being used in FIGS. 1 and 2 for corresponding components where appropriate) in that it includes an additional mixer 16 and associated sum (or difference) frequency filter 17 between the first delay line 1 and the mixer 3. The mixer 16 is arranged to mix the output of the first delay line 1 with an input signal $S_i(t)$, the sum (or difference) frequency output of this mixer then being mixed with the output of the second dispersive delay line 2. The output signal $S_o(t)$ appears as before at the output of filter 4.

Again, in accordance with the invention, both dispersive delay lines have a cubic phase variation characteristic with time. Thus, let the input signal $S_i(t)$ be:

$$S_i(t) = S_i \cos(wt + \theta(w))$$

and let the impulse response at the two delay lines be $$T_1 e^{i\theta 1(t)}; T_2 e^{i\theta 2(t)}$$

where
$\theta_1(t) = \theta_{10} + a_1 t + b_1 t^2 + c_1 t^3$ $\theta_2(t) = \theta_{20} + a_2 t + b_2 t^2 + c_2 t^3$ $\theta(w)$ is the phase of the input signal and $a_1$, $b_1$, $c_1$ and $a_2$, $b_2$, $c_2$ are constants as before. The output of the first mixer 16, as filtered to pass the sum frequency only is $$S_m(t) = \tfrac{1}{2} S_i T_1 \cos(wt + \theta_{10} + a_1 t + b_1 t^2 + c_1 t^3 + \phi(w))$$

The output of the second mixer 3, impulsed after relative delay $t_c$ and as filtered to pass the sum frequency only, is:

$$S_o(t) = \tfrac{1}{4} S_i T_1 T_2 \cos[t(w + a_1 + a_2 + 2t_c b_2 + 3t_c^2 c_2)$$
$$+ t^2(b_1 + b_2 + 3t_c c_2) + t^3(c_1 + c_2)$$
$$+ a_2 t_c + b_2 t_c^3 + \theta_{10} + \phi(w)]$$

As before, cubic phase terms are eliminated in the present sum frequency implementation by making $c_1 = -c_2$, and alternatively in the difference frequency implementation, by making $c_1 = c_2$. Thus, let $c_1 = -c_2$. Then $$S_o(t) = \tfrac{1}{4} S_i T_1 T_2 \cos[t(w + a_1 + a_2 + 2t_c b_2 + 3t_c^2 c_2)$$
$$+ t^2(b_1 + b_2 + 3t_c c_2)$$
$$+ a_2 t_c + b_2 t_c^2 + c_2 t_c^3 + \theta_{10} + \theta_{20} + \phi(w)]$$

Thus the circuit of FIG. 2 is a dispersive filter in the time domain with a time characteristic.

$$A(t) = A e^{i\theta(t)}$$

where
$A = \tfrac{1}{4} T_1 T_2$ and
$\theta(t) = t(a_1 + a_2 + 2t_c b_2 + 3t_c^2 c_2) + t^2(b_1 + b_2 + 3t_c c_2) + a_2 t_c + b_2 t_c^2 + c_2 t_c^3$ The filter dispersive frequency response $w_f(t)$ is given by $$w_f(t) = d\theta(t)/dt = a_1 + a_2 + 2t_c b_2 + 3t_c^2 c_2 + 2t(b_1 + b_2 + 3t_c c_2)$$

The terms $2t_c b_2 + 3t_c^2 c_2$ give rise to a frequency shift which varies with the relative delay time $t_c$. The chirp rate, or frequency-time slope $\beta$ of the filter is given by $$= dw_f(t)/dt = 6t_c c_2 + 2b_1 + 2b_2$$

Thus, by matching the cubic or higher order phase terms of the two dispersive filters, the chirp rate $\beta$ is made linear, and varies linearly with the relative delay time $t_c$ which, as in the chirp generator circuit of FIG. 1, may be manually adjustable, or automatically varied by means of the variable time delay impulsing circuit 6.

Again, the frequency response of the dispersive filter circuit may be amplitude weighted in exactly the same way as the chirp generator of FIG. 1.

As mentioned above, dispersive filters in accordance with the present invention are the Fourier analogue or dual of dispersive filters the subject of the co-pending UK Patent Application, producing frequency compression or dispersion rather than time compression or dispersion. An "all singing-all dancing" filter, in which both time and frequency compression or dispersion characteristics can be varied, may be produced by applying the output of a dispersive filter in accordance with the earlier patent application to the input of a dispersive filter in accordance with the present invention.

What is claimed is:

1. A surface acoustic wave device comprising: first and second surface acoustic wave dispersive delay lines having input and output connections; first and second pulse means for applying respective input pulses to said delay lines input connections, said pulse means including means for varying the relative time delay between said respective input pulses to said delay lines; and mixer means for mixing together the outputs of said delay lines.

2. The device of claim 1 wherein said delay lines have matched phase variation characteristics of cubic and higher order terms providing an output signal having a linear frequency-time slope.

3. The device of claim 2 wherein one of said delay lines is amplitude weighted to reduce the amplitude of output signals at other than the center frequency and provide a non-linear frequency-amplitude characteristic.

4. The device of claim 2 wherein said mixer means is capable of providing the sum and difference frequencies of said outputs, and including an output filter passing one of said frequencies.

5. The device of claim 2 wherein variation of said time delay between said pulses produces variation in the frequency-time slope of said output signal.

6. The device of claim 2 wherein said pulse means includes counting means for varying the separation of said input pulses applied to said delay lines.

7. The device of claim 6 including means for automatically varying the relative separation of said input pulses applied to said delay lines.

8. The device of claim 6 including memory means for storing different count numbers for said counting means.

9. A surface acoustic wave device comprising:
first and second surface acoustic wave dispersive delay lines;
pulse means for applying input pulses to said delay lines having a variable relative time delay between said pulses;
means supplying an input signal;
first mixer means for mixing together said input signal with the output signal of one of said delay lines; and
second mixer means for mixing together the output signal of said first mixer with the output signal of the other of said delay lines.

10. The device of claim 9 wherein said delay lines have matched phase variation characteristics of cubic and higher order terms providing an output signal having a linear frequency-time slope.

11. The device of claim 10 wherein one of said delay lines is amplitude weighted to reduce the amplitude of output signals at other than the center frequency and provide a non-linear frequency-amplitude characteristic.

12. The device of claim 10 wherein said first and second mixer means are capable of providing the sum and difference frequencies of the respective signals mixed together therein, and including a first filter passing one of said frequencies from said first mixer means, and an output filter passing one of said frequencies from said second mixer means.

13. The device of claim 10 wherein variation of said time delay between said pulses produces variation in the frequency-time slope of said output signal.

14. The device of claim 13 wherein said pulse means includes counting means for varying the separation of pulses applied to said delay lines.

15. The device of claim 14 including means for automatically varying the relative separation of pulses applied to said delay lines.

16. The device of claim 14 including memory means for storing different count numbers for said counting means.

* * * * *

UNITED STATES PATENT AND TRADEMARK OFFICE
CERTIFICATE OF CORRECTION

PATENT NO. : 4,288,750

DATED : September 8, 1981

INVENTOR(S) : CLELAND O. NEWTON et al

It is certified that error appears in the above-identified patent and that said Letters Patent are hereby corrected as shown below:

On the title page:

Item [73] should read as follows:

Assignee: The Secretary of State for Defence in Her Britannic Majesty's Government, Whitehall, London, England.

Signed and Sealed this

First Day of December 1981

[SEAL]

Attest:

Attesting Officer

GERALD J. MOSSINGHOFF

Commissioner of Patents and Trademarks